United States Patent
Tsacoyeanes et al.

(10) Patent No.: US 7,142,353 B2
(45) Date of Patent: Nov. 28, 2006

(54) SYSTEM AND METHOD UTILIZING AN ELECTROOPTIC MODULATOR

(75) Inventors: James G. Tsacoyeanes, Southbury, CT (US); Pradeep K. Govil, Norwalk, CT (US)

(73) Assignee: ASML Holding N.V., Veldhoven (NL)

( * ) Notice: Subject to any disclaimer, the term of this patent is extended or adjusted under 35 U.S.C. 154(b) by 77 days.

(21) Appl. No.: 10/972,582

(22) Filed: Oct. 26, 2004

(65) Prior Publication Data

US 2006/0087720 A1    Apr. 27, 2006

(51) Int. Cl.
*G02F 1/00*    (2006.01)
(52) U.S. Cl. ............ 359/321; 359/322; 359/245
(58) Field of Classification Search ........ 359/321, 359/322, 245, 246, 247, 248, 251, 315, 318, 359/238
See application file for complete search history.

(56) References Cited

U.S. PATENT DOCUMENTS

| | | | |
|---|---|---|---|
| 4,688,900 A * | 8/1987 | Doane et al. | 349/87 |
| 4,768,043 A | 8/1988 | Saito et al. | |
| 5,299,054 A * | 3/1994 | Geiger | 359/251 |
| 5,872,360 A * | 2/1999 | Paniccia et al. | 250/341.4 |
| 6,009,110 A * | 12/1999 | Wiechmann et al. | 372/10 |
| 6,708,003 B1* | 3/2004 | Wickham et al. | 398/102 |
| 6,709,003 B1* | 3/2004 | Laughlin et al. | 280/623 |
| 6,924,870 B1* | 8/2005 | Wang et al. | 349/156 |
| 2003/0133651 A1* | 7/2003 | Hakimi et al. | 385/27 |
| 2003/0169160 A1* | 9/2003 | Rodriguez et al. | 340/426.1 |
| 2005/0084199 A1* | 4/2005 | Hirohashi et al. | 385/14 |
| 2006/0023280 A1* | 2/2006 | Mossberg | 359/15 |

FOREIGN PATENT DOCUMENTS

EP    1 262 836 A1    12/2002

OTHER PUBLICATIONS

U.S. Appl. No. 11/005,222, filed Dec. 7, 2004, Tsacoyeanas et al.
U.S. Appl. No. 11/039,900, filed Jan. 24, 2005, Govil et al.
*Lithium Triborate—LBO*, EKSMA Co., 2 pages, undated.

* cited by examiner

*Primary Examiner*—Timothy Thompson
(74) *Attorney, Agent, or Firm*—Sterne, Kessler, Goldstein & Fox P.L.L.C.

(57) ABSTRACT

A system and method utilize an optical element that receives an electrical field, which changes an index of refraction in at least one direction within the optical element. The change in index of refraction imparts a change to a beam of radiation passing through the optical element. A material used to form the optical element exhibits characteristics, such that wavelengths of the beam of radiation above about 155 nanometers are transmitted through the optical element with little or not absorption or attenuation.

23 Claims, 8 Drawing Sheets

SYSTEM AND METHOD UTILIZING AN ELECTROOPTIC MODULATOR

BACKGROUND OF THE INVENTION

1. Field of the Invention

The present invention is related to electrooptic modulators.

2. Background Art

Electrooptic modulators are used in many systems to perform, for example, linear and non-linear amplitude and phase modulation, light intensity profile modulation, polarization control, beam steering, etc. As wavelengths of radiation used in a system with an electrooptic modulator continually decrease, intensity efficiency has continually decreased as well. At some wavelengths, substantially all of the radiation is absorbed by the electrooptic modulator.

Therefore, what is needed is an electrooptic modulator that allows a beam of radiation at a desired wavelength to be transmitted with little or no absorption or attenuation or attenuation at a desired tolerance.

BRIEF SUMMARY OF THE INVENTION

An embodiment of the present invention provides a system comprising an optical element and an electric field generator. The electric field generator generates an electrical field that is applied to the optical element, such that the applied electrical field changes index of refraction in at least one direction in the optical element.

In one example, the optical element transmits substantially all of a radiation beam having a wavelengths of 155 nanometers and higher.

In one example, the optical element is made from Lithium Triborate ($LiB_3O_5$).

Another embodiment of the present invention provides a method, comprising the steps of (a) transmitting substantially all of a beam of radiation at a desired wavelength through an optical element, (b) generating an electrical field, (c) applying the electrical field to the optical element, and (d) using step (c) to change an index of refraction in at least one direction in the optical element.

In one example, the method also comprises the step of using an optical element made from Lithium Triborate ($LiB_3O_5$).

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 1, 2, and 3 show various systems forming electrooptic modulators exhibiting desired characteristics, according to various embodiments of the present invention.

Figure 6:
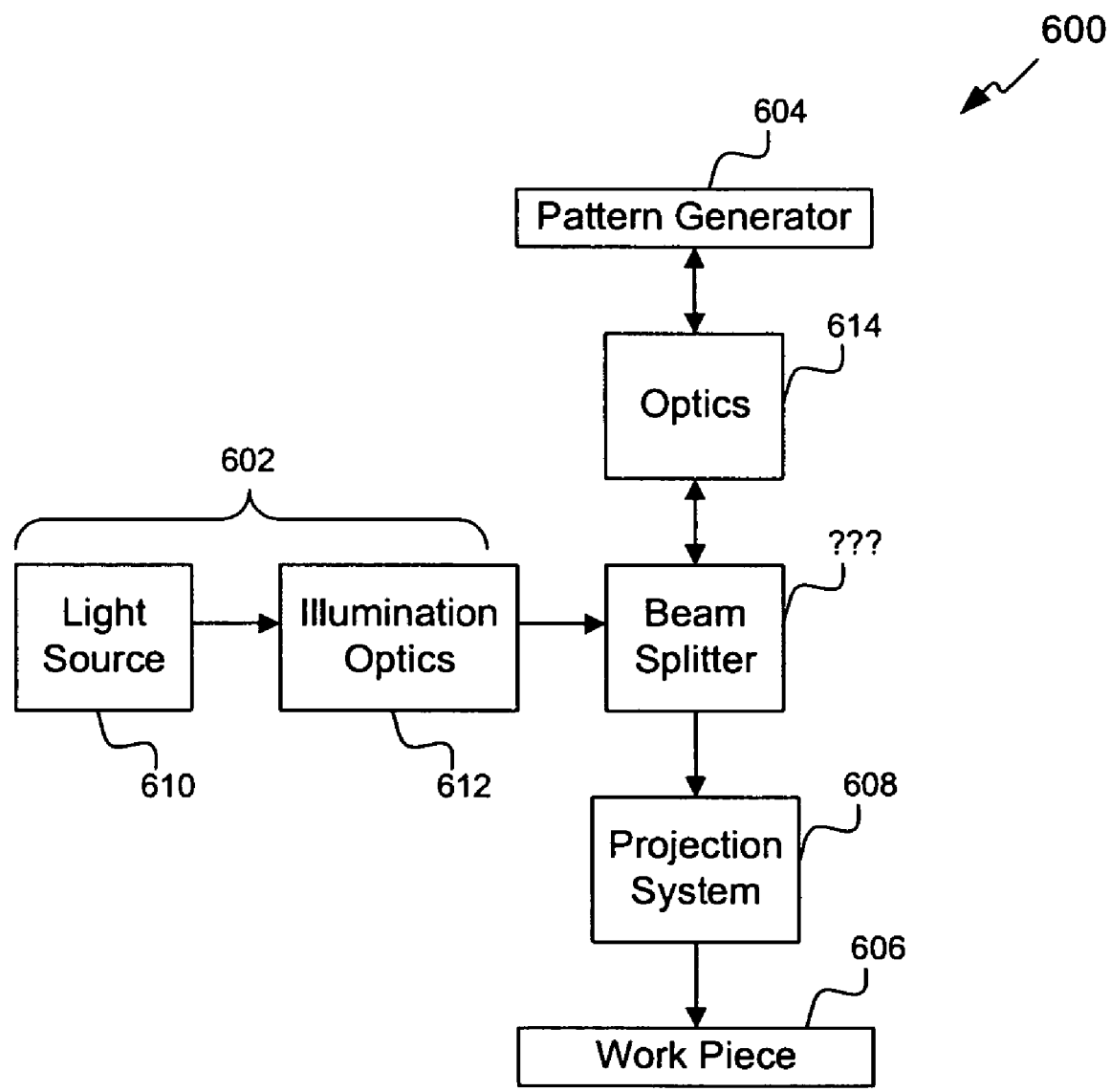
Figure 7:
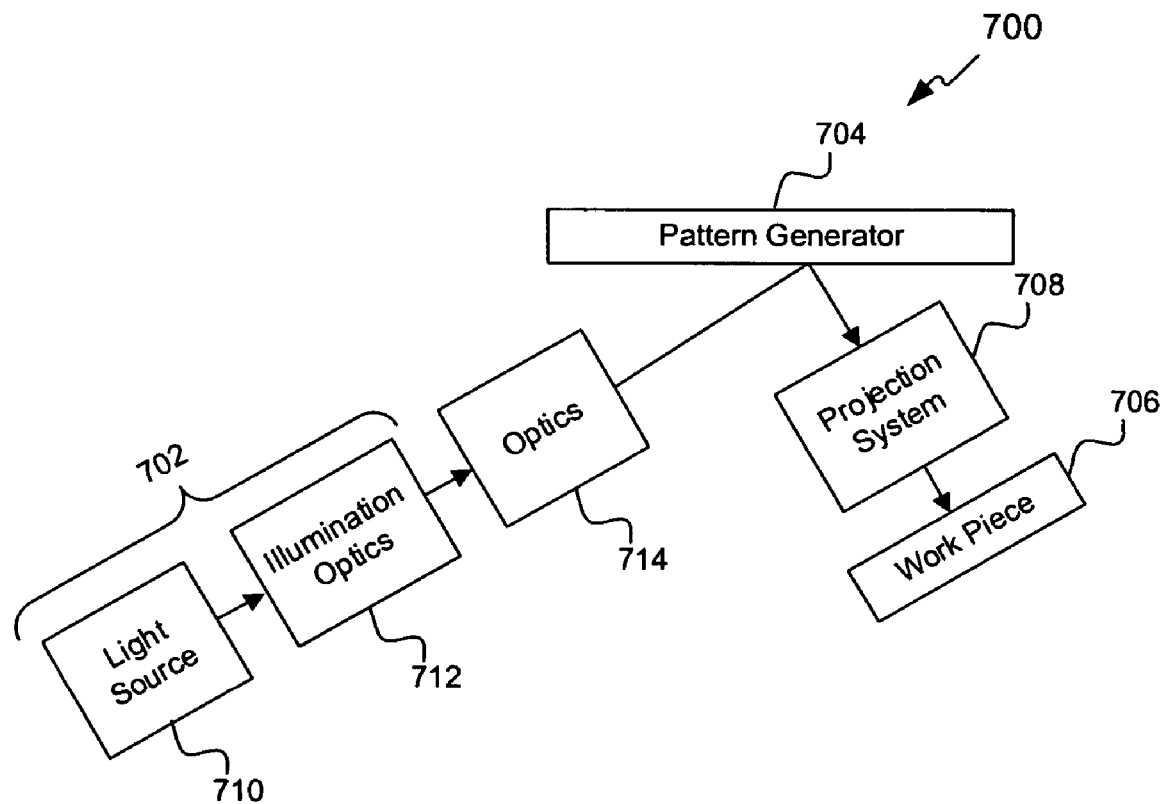
Figure 8:
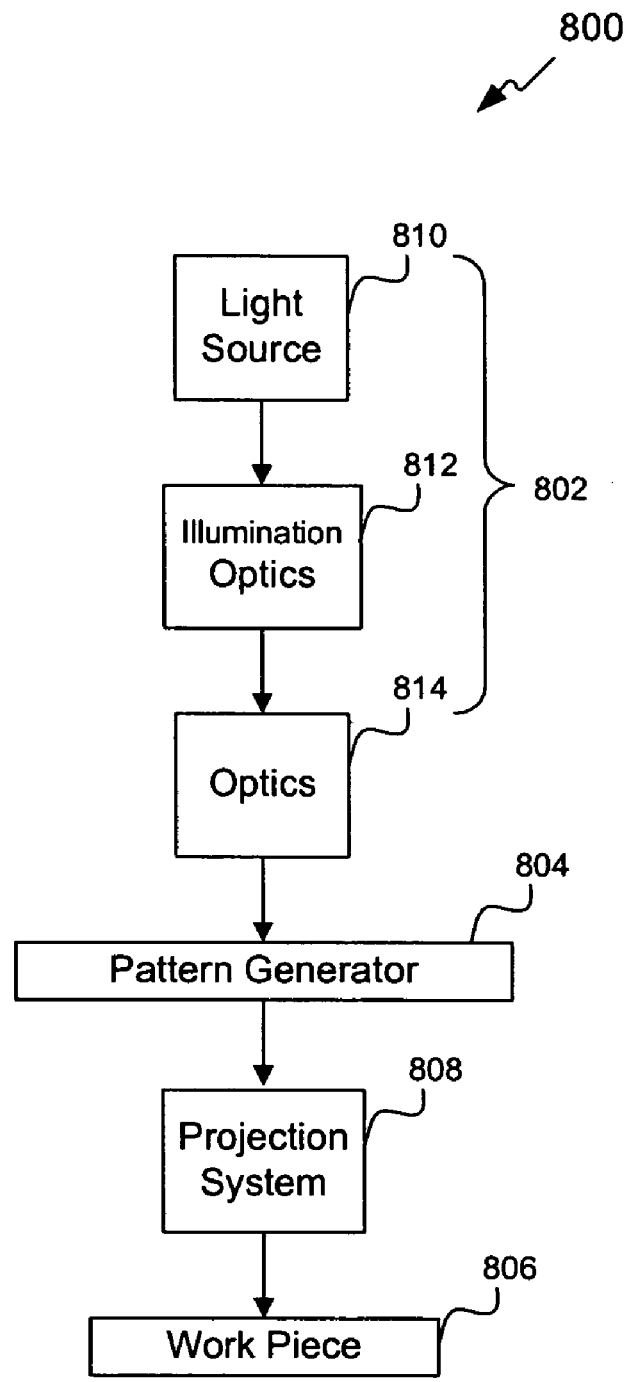

FIGS. 6, 7, and 8 show various lithography systems having an electrooptic modulator therein, according to various embodiments of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention provide a system and method utilizing an optical element that receives an electrical field, which changes an index of refraction in at least one direction within the optical element. The change in index of refraction imparts a change to a beam of radiation passing through the optical element. A material used to form the optical element exhibits characteristics, such that wavelengths at a desired wavelength, for example, radiation above about 155 nanometers, are transmitted through the optical element with little or not absorption or attenuation. In one example, an optical element is made from Lithium Triborate ($LiB_3O_5$).

In this description, "little or no absorption or attenuation" means less than about 20% absorption or attenuation, unless otherwise defined. An exact tolerance for absorption or attenuation can be application specific, so other ranges are also contemplated within the scope of the present invention.

In this description "short wavelength" means light in the extreme ultra violet (EUV) or deep ultra violet (DUV) range, for example, at least above about 155 nanometers. However, other wavelength ranges, above or below this range, are also contemplated within the scope of the invention.

Exemplary Electrooptic Modulators

Figure 1:
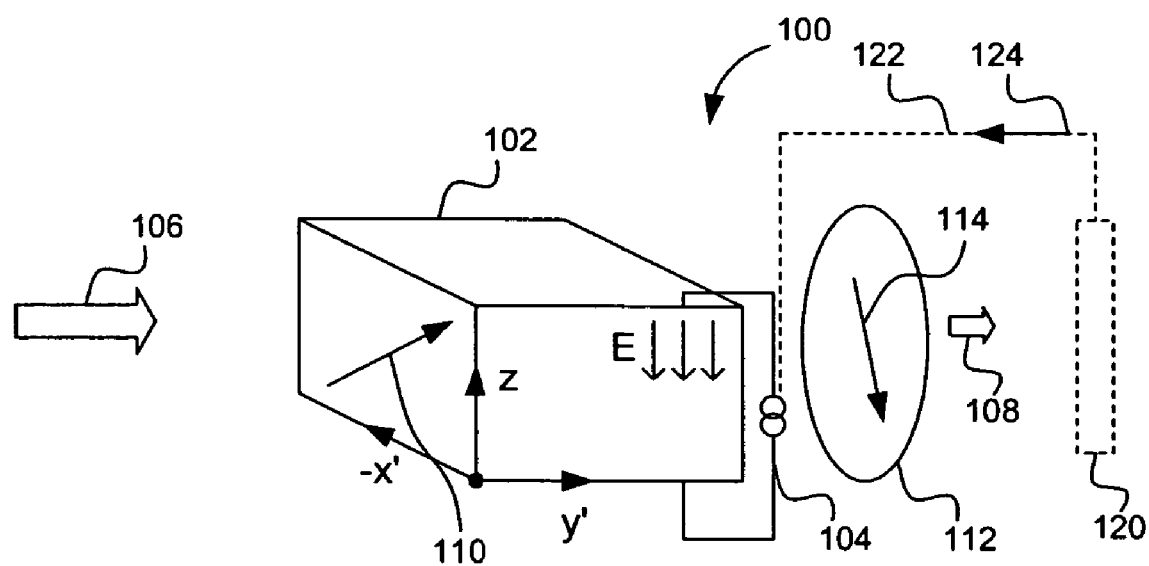
Figure 2:
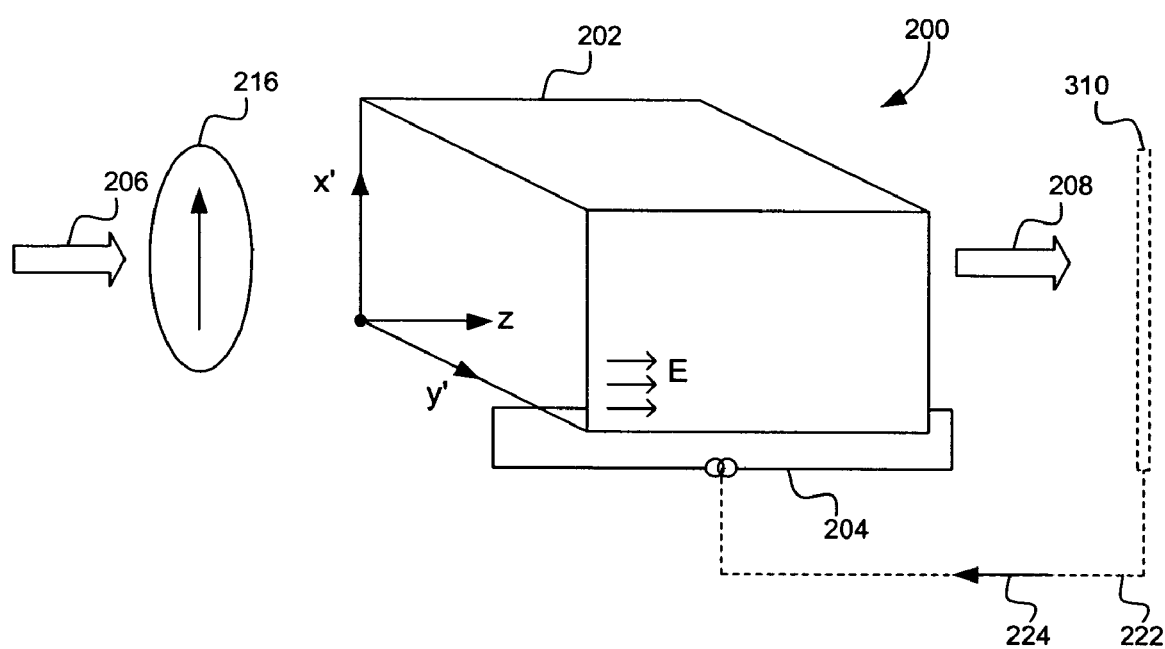
Figure 3:
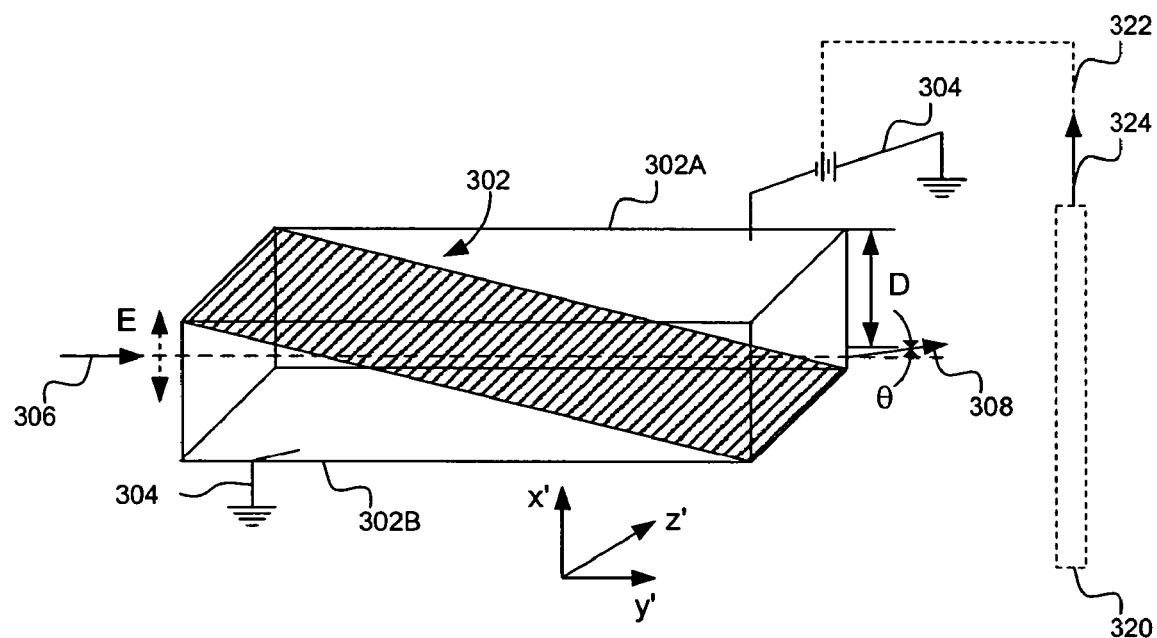

FIGS. 1, 2, and 3 show various systems 100, 200, and 300 forming electrooptic modulators exhibiting desired short wavelength characteristics, according to various embodiments of the present invention.

FIG. 1 shows system 100 that includes an optical element 102 receiving an electric field E from an electric field generator 104. Electric field E is perpendicular to a direction of propagation of a beam of radiation 106 through optical element 102, discussed below, for example. A corner of optical element 102 shows an orientation of optical element 102 in the X, Y, and Z directions. Application of electrical field E to optical element 102 forms an electrooptic modulator, which in this embodiment can be used to amplitude modulate beam 106 to produce an amplitude modulated output beam 108. A wave front or phases of components of beam 106 along the x' and z directions are modulated by changing the indices of refraction in those directions through the applied electric field E.

In one example, polarization of beam 106, which is initially polarized as shown by arrow 110, is changed using polarizer 112 that orients output beam 108 in the direction of arrow 114. With polarizer 112 oriented as shown, an intensity of beam 106 will change depending on the incident polarization, which is controlled by electric field generator 104.

In this embodiment, system 100 is a transverse electrooptic amplitude modulator. It is to be appreciated, that in an alternative embodiment system 100 can also be made that operate as longitudinal amplitude modulator.

In one example, system 100 also includes a control system including a detector 120 and a feedback path 122. Output beam 108 is received on the detector 120, which generates a control signal 124 transmitted through feedback path 122 to electric field generator 104. In this example, output beam 108 can be adjusted until it is of a desired tolerance.

FIG. 2 shows system 200 that includes an optical element 202 receiving an electric field E from a electric field generator 204. Electric field E is parallel to a direction of propagation of a beam of radiation 206 through optical element 202. A corner of optical element 202 shows an orientation of optical element 202 in the X, Y, and Z directions. Application of electrical field E to optical element 202 forms an electrooptic modulator, which in this embodiment can be used to phase modulate beam 206 to thereby produce an phase modulated output beam 208.

In this embodiment, instead of orienting optical element 202 so that linearly polarized beam 206 is equally split between two induced birefringent axes, beam 206 is incident along one axis using polarizer 216. A voltage source 204 generating an electrical field induces a varying index of refraction change within optical element 202, which introduces phase modulation.

In one example, system 200 also includes a control system including a detector 220 and a feedback path 222. Output beam 208 is received on the detector 220, which generates a control signal 224 transmitted through feedback path 222 to electric field generator 204. In this example, output beam 208 can be adjusted until it is of a desired tolerance.

FIG. 3 shows system 300 that includes an optical element 302 including a first portion 302A and a second portion 302B (e.g., first and second prisms, or the like) that receive an electric field E from a electric field generator 304. In one example, two wedges 302A and 302B of crystal 302 are coupled together with their crystal axes reversed. In this example, electric field E varies in direction with respect to a direction of propagation of a beam of radiation 306 through optical element 302. An orientation of optical element 302 in the X, Y, and Z directions is shown adjacent optical element 302. Application of electrical field E to optical element 302 forms an electrooptic modulator, which in this embodiment can be used to steer beam 306 to produce an output beam 308 that propagates in a direction at an angle θ with respect to beam 306.

In one example, system 300 also includes a control system including a detector 320 and a feedback path 322. Output beam 308 is received on the detector 320, which generates a control signal 324 transmitted through feedback path 322 to electric field generator 304. In this example, output beam 308 can be adjusted until it is of a desired tolerance.

Figure 4:
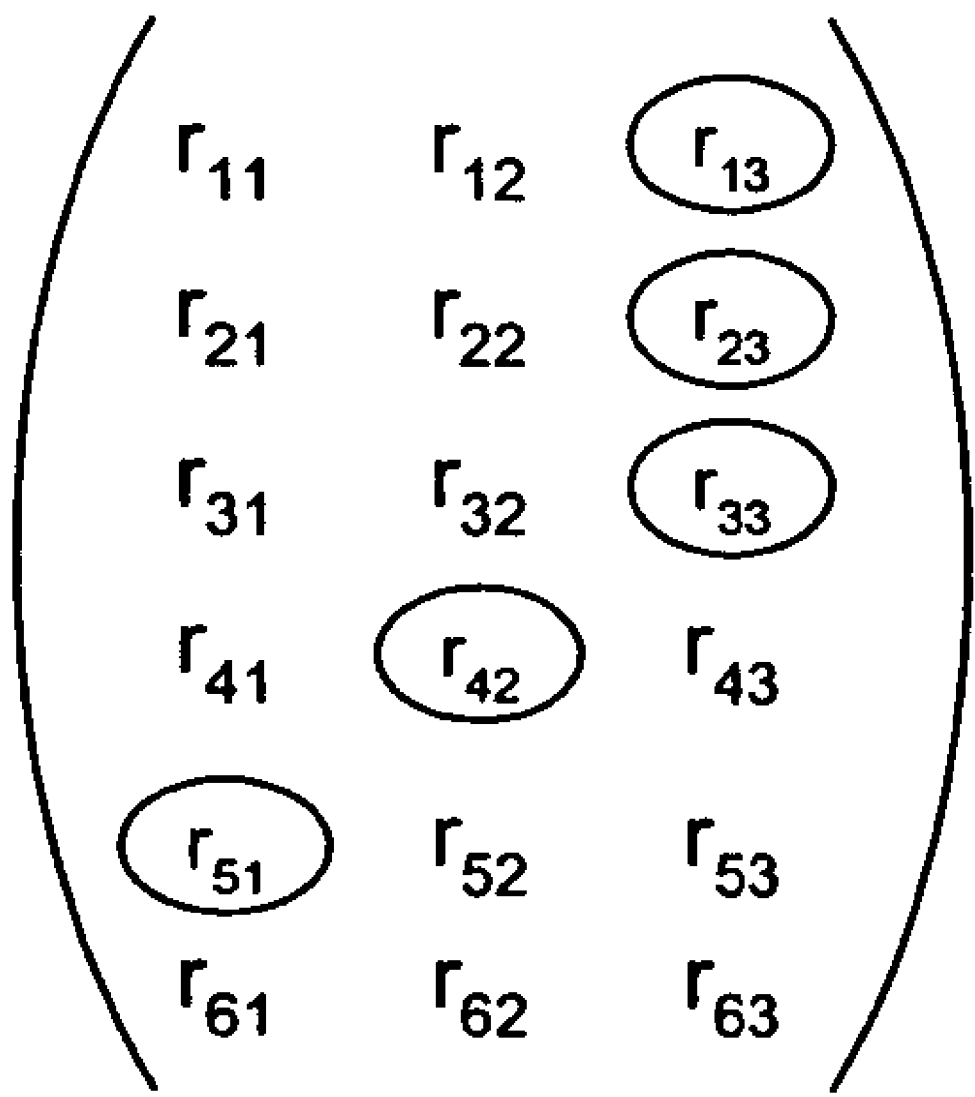
FIG. 4 shows a form of an electrooptic tensor for a mm2 monoclinic crystal symmetry class of a material used for an electrooptic modulator, according to one embodiment of the present invention.

FIG. 4 shows a form of an electrooptic tensor for a symmetry group designation mm2 in a monoclinic crystal symmetry class of a material used for an electrooptic modulator, according to one embodiment of the present invention. In this embodiment, the circled components ($r_{13}$, $r_{23}$, $r_{33}$, $r_{42}$, and $r_{51}$) are nonzero elements. If nonzero elements are present in this tensor, then a material having these characteristics exhibits the electrooptic effect.

With reference again to FIG. 3, in that embodiment, an optical element 302 (e.g., an electrooptic crystal) is used to deflect beam 306. As discussed above, in one example, two wedges 302A and 302B of crystal 302 are coupled together with their crystal axes reversed. By applying a voltage using electric field generator 304 to the two crystals 302A and 302B, an index of refraction of each of the two crystals 302A and 302B is varied with respect to each other, which results in a deflected output beam 308. An angle of deflection (θ) through crystals 302A and 302B depends on: (1) the magnitude of electrooptic tensor components that are used (e.g., depending on the crystal orientation), as shown in FIG. 4 and discussed above, (2) the voltage applied by electric field generator 304, and (3) dimensions of crystal 302.

An example reference teaching of the physics of electrooptic modulators is Chapter 14 of Quantum Electronics by Amnon Yariv, publisher: John Wiley & Sons, ISBN: 0-471-97176-6, which is incorporated by reference herein in its entirety.

In one example, optical elements 102, 202, and/or 302 are a crystal material having characteristics shown in FIG. 4. For example, one a crystal material that can be used is Lithium Triborate ($LiB_3O_5$) (LBO) manufactured by EKSMA Co. of Vilnius, Lithuania. In other examples, potassium dihydrogen phosphate ($KH_2PO_4$), or ammonium dihydrogen phosphate ($NH_4H_2PO_4$) can be used, which exhibit similar electrooptic characteristics to LBO, but have lower transmission efficiency than LBO.

In the above embodiments, the electrooptic modulators make use of the linear electrooptic effect, which results from a change in the indices of refraction in different directions in an optical element (e.g., a crystal) due to an applied electric field. The effect exists only in crystals that do not possess inversion symmetry. This can be expressed in an index of ellipsoid equation, which expresses the change in anisotropy of a crystal with the electric field. Equation 1 describes the general form for the equation of the index of ellipsoid for an arbitrarily chosen orthogonal coordinate system in a crystal as:

$$\left(\frac{1}{n^2}\right)_1 x^2 + \left(\frac{1}{n^2}\right)_2 y^2 + \left(\frac{1}{n^2}\right)_3 z^2 + 2\left(\frac{1}{n^2}\right)_4 yz + 2\left(\frac{1}{n^2}\right)_5 xz + 2\left(\frac{1}{n^2}\right)_6 xy = 1 \quad 1.$$

Where n is the constant for the index of refraction for a material being used.

The change in index of refraction (n) due to an applied electric field (E) can be expressed in the matrix form in Equation 2 below:

$$\begin{bmatrix} \Delta\left(\frac{1}{n^2}\right)_1 \\ \Delta\left(\frac{1}{n^2}\right)_2 \\ \Delta\left(\frac{1}{n^2}\right)_3 \\ \Delta\left(\frac{1}{n^2}\right)_4 \\ \Delta\left(\frac{1}{n^2}\right)_5 \\ \Delta\left(\frac{1}{n^2}\right)_6 \end{bmatrix} = \begin{bmatrix} r_{11} & r_{12} & r_{13} \\ r_{21} & r_{22} & r_{23} \\ r_{31} & r_{32} & r_{33} \\ r_{41} & r_{42} & r_{43} \\ r_{51} & r_{52} & r_{53} \\ r_{61} & r_{62} & r_{63} \end{bmatrix} \begin{bmatrix} E_1 \\ E_2 \\ E_3 \end{bmatrix} \quad 2.$$

The second matrix in this expression is the electrooptic tensor, discussed above with respect to FIGS. 1, 2, 3, and 4. As discussed above, if nonzero elements are present in this tensor, then the material exhibits the electrooptic effect.

Usually a coordinate system is determined so that equation 1 in the presence of an applied electric field reduces to Equation 3 as follows:

$$\left(\frac{1}{n^2}\right)_{1'} x'^2 + \left(\frac{1}{n^2}\right)_{2'} y'^2 + \left(\frac{1}{n^2}\right)_{3'} z'^2 = 1 \quad 3.$$

Depending on the exact nature of the electrooptic tensor, a direction for the applied electric field can be determined that induces a change in the indices of refraction in perpendicular directions. Thus, the electrooptic modulator operates because the voltage dependent index of refraction induces a retardation between the incident electric field components in the perpendicular directions. The directions chosen depend upon the symmetry properties of the crystal of interest. The retardation is proportional to the applied voltage and the corresponding electrooptic tensor component. The net effect of this is to create a voltage varying phase difference between the two directions, which can be used for different applications. In one example, by applying voltages so that the phase difference is less than $\pi$, linearly polarized light can be changed into elliptically polarized light. In another example, when the phase difference is $\pi$, the incident linearly polarized light is rotated 90 degrees and remains linearly polarized.

Exemplary Operation

Figure 5:
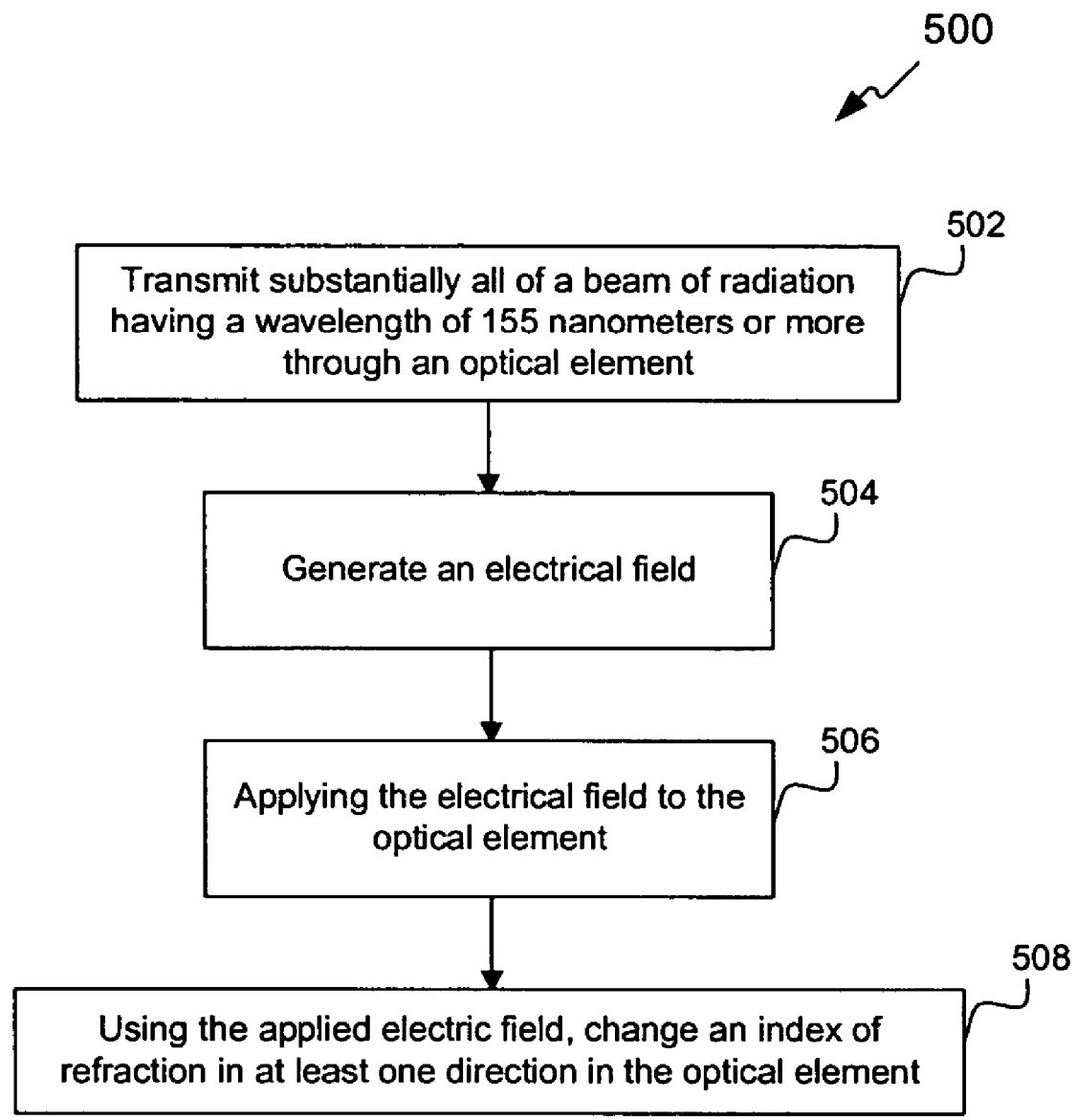
FIG. 5 is a flowchart depicting a method, according to one embodiment of the present invention.

FIG. 5 is a flowchart depicting a method 500, according to one embodiment of the present invention. Method 500 can be used during operation of systems 100, 200, and/or 300, or other similar systems.

In step 502, substantially all of a beam of radiation having a wavelength (e.g., 155 nanometers or more) is transmitted through an optical element. In step 504, an electrical field is generated. In step 506, the electrical field is applied to the optical element. In step 508, the electric field is used to change an index of refraction in at least one direction in the optical element, such that the transmitted beam is modulated, beam steered, or the like.

There are many known uses for optical elements that can perform modulation, beam steering, or the like. For example, various types of mask-based or maskless lithography systems.

Exemplary Environment: Lithography

FIGS. 6, 7, and 8 show various lithography systems 600, 700, and 800 having an electrooptic modulator therein, according to various embodiments of the present invention. For example, electrooptic modulators formed from systems 100, 200, and/or 300 can be used when wavelengths of radiation used in lithography systems 600/700/800 are about 155 nanometers or above. In these systems, radiation from an from an illumination system 602/702/802 illuminates a pattern generator 604/704/804 to produce patterned light, which is directed from pattern generator 604/704/804 towards a work piece 606/706/806 via a projection system 608/708/808.

In various embodiments, work piece 606/706/806 is, but is not limited to, a substrate, a wafer, a flat panel display substrate, print head, micro or nano-fluidic devices, or the like.

As is known, illumination system 602/702/802 can include a light source 610/710/810 and illumination optics 612/712/812 and pattern generator can have optics 614/714/814. One or both of these optics can include one or more optical elements (e.g., lenses, mirrors, etc.).

In various examples, pattern generator 604/704/804 can be a mask-based or maskless pattern generator, as would become apparent to one of ordinary skill in the art. The masked-based or maskless system can be associated with a lithography, photolithography, microlithography, or immersion lithography system.

Depending on the use of the electrooptic modulator, for example one shown and discussed above in regards to FIGS. 1–5, the modulator can be positioned in various part of lithography systems 600/700/800.

CONDLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system, comprising:
    an illumination system configured to output a radiation beam;
    a pattern generator configured to pattern the radiation beam; and
    a projection system configured to project the patterned beam onto a target of a work piece, the projection system including,
        an optical element positioned in one of a pupil plane or an image plane of the projection system and configured to transmit substantially all of a radiation beam having a wavelength of 155 nanometers or more, and
        an electric field generator that generates an electrical field that is applied to the optical element, such that the applied electrical field changes index of refraction in at least one direction in the optical element.

2. The system of claim 1, wherein the optical element comprises Lithium Triborate (LiB$_3$ O$_5$).

3. The system of claim 1, wherein the change in the index of refraction causes amplitude modulation of the radiation beam.

4. The system of claim 1, wherein the change in the index of refraction causes phase modulation of the radiation beam.

5. The system of claim 1, wherein the change in the index of refraction causes beam steering of the radiation beam.

6. The system of claim 1, wherein the change in the index of refraction causes linear modulation of the radiation beam.

7. The system of claim 1, wherein the change in the index of refraction causes non-linear modulation of the radiation beam.

8. The system of claim 1, wherein the change in the index of refraction causes a change in an intensity profile of the radiation beam.

9. The system of claim 1, wherein the change in the index of refraction causes a change in the polarization of the radiation beam.

10. The system of claim 1, further comprising:
a control system that controls an output beam generated by the optical element.

11. The system of claim 10, wherein the control system comprises:
a detector that receives the output beam and generates a control signal therefrom; and
a feedback loop coupled between the detector and the electric field generator that transmits the control signal to the electric field generator.

12. A method, comprising:
(a) patterning a beam of radiation having a wavelength of 155 nanometers or more using a pattern generator;
(b) positioning an optical element in one of a pupil plane or an image plane of a projection system that receives the patterned beam;
(c) generating an electrical field;
(d) applying the electrical field to the optical element;
(e) using step (d) to change an index of refraction in at least one direction in the optical element;
(f) transmitting the patterned beam through the optical element; and
(g) projecting the patterned beam onto a target of a work piece using the projection system.

13. The method of claim 12, further comprising providing the optical element as Lithium Triborate ($LiB_3O_5$).

14. The method of claim 12, wherein the change in the index of refraction causes amplitude modulation of the radiation beam.

15. The method of claim 12, wherein the change in the index of refraction causes phase modulation of the radiation beam.

16. The method of claim 12, wherein the change in the index of refraction causes beam steering of the radiation beam.

17. The method of claim 12, wherein the change in the index of refraction causes linear modulation of the radiation beam.

18. The method of claim 12, wherein the change in the index of refraction causes non-linear modulation of the radiation beam.

19. The method of claim 12, wherein the change in the index of refraction causes a change in an intensity profile of the radiation beam.

20. The method of claim 12, wherein the change in the index of refraction causes a change in polarization of the radiation beam.

21. The method of claim 12, further comprising:
controlling an output beam generated by the optical element using a control system.

22. The method of claim 21, wherein the controlling step comprises:
detecting the output beam;
generating a control signal; and
using the control signal in step (c).

23. The method of claim 12, wherein step (f) comprises transmitting of the beam having a wavelength of 155 nanometer through the optical element substantially free from attenuation or absorption.

* * * * *

UNITED STATES PATENT AND TRADEMARK OFFICE
CERTIFICATE OF CORRECTION

| | |
|---|---|
| PATENT NO. | : 7,142,353 B2 |
| APPLICATION NO. | : 10/972582 |
| DATED | : November 28, 2006 |
| INVENTOR(S) | : Tsacoyeanes et al. |

Page 1 of 1

It is certified that error appears in the above-identified patent and that said Letters Patent is hereby corrected as shown below:

Column 6
Line 64 please replace "(LiB$_3$ O$_5$)" with --(LiB$_3$O$_5$)--.

Column 8
Line 35 please replace "transmitting of the beam" with --transmitting the beam--.

Signed and Sealed this

Twenty-seventh Day of February, 2007

JON W. DUDAS
*Director of the United States Patent and Trademark Office*